| United States Patent [19] | [11] Patent Number: 4,914,004 |
| Köhler et al. | [45] Date of Patent: Apr. 3, 1990 |

[54] TWO-LAYER SYSTEM

[75] Inventors: Manfred Köhler, Darmstadt; Eike Poetsch, Mühltal; Jörg Ohngemach, Reinheim; Dieter Dorsch, Darmstadt; Rudolf Eidenschink, Mühltal, all of Fed. Rep. of Germany; Gerhard Greber, Bad Vöslau, Austria

[73] Assignee: Merck Patent Gesellschaft Mit Beschränkter Haftung, Darmstadt, Fed. Rep. of Germany

[21] Appl. No.: 90,283

[22] Filed: Aug. 28, 1987

[30] Foreign Application Priority Data

Aug. 30, 1986 [DE] Fed. Rep. of Germany ....... 3629543
Jan. 31, 1987 [DE] Fed. Rep. of Germany ....... 3702897

[51] Int. Cl.$^4$ .......................... G03C 1/76; G03C 1/68
[52] U.S. Cl. ..................................... 430/272; 430/273; 430/271; 430/275; 522/904; 522/905; 522/35; 522/71; 502/5; 502/522
[58] Field of Search ................... 522/904, 905, 35, 71; 430/271, 273, 272, 275; 502/5, 522

[56] References Cited

U.S. PATENT DOCUMENTS

| 3,776,889 | 12/1973 | Pande et al. | 528/69 X |
| 4,187,111 | 2/1980 | Chandross et al. | 430/2 |
| 4,439,514 | 3/1984 | Garito | 430/272 |
| 4,551,418 | 11/1985 | Hult et al. | 430/325 |
| 4,677,137 | 6/1987 | Bany et al. | 502/522 X |

FOREIGN PATENT DOCUMENTS 161463 11/1985 European Pat. Off.
0109702 9/1978 Japan ................... 430/271

*Primary Examiner*—Roland E. Martin
*Assistant Examiner*—Cynthia Hamilton
*Attorney, Agent, or Firm*—Millen, White & Zelano

[57] ABSTRACT

Radiation-curable two-layer systems containing immobilized photoinitiators are suitable for the production of coatings of constant thickness and good adhesion, and relief structures of high resolution and edge steepness.

5 Claims, No Drawings

TWO-LAYER SYSTEM

BACKGROUND OF THE INVENTION

The invention relates to a two-layer system which can be cured by radiation and to the use thereof for the production of polymeric coatings.

Radiation-curable systems are materials which are sought after and are frequently employed in the production of photopolymerized coatings for surface finishing and in the production by photolithography of photopolymerized relief structures. The main field of use in this respect is the production of paint coatings on a very wide variety of substrates. In addition, such materials are used, in the production of microelectronic and opto-electronic components and switch gear, as a photoresist in the production of switching structures or in the latter as protective or passivating layers having special resistance to heat and chemicals, as insulating layers or as dielectrics or, in liquid-crystal display cells, as orientation layers. Further applications are use as an etch resist and plating resist and as a solder resist in the production of printed circuits and printing plates and other reprographic materials. Finally, systems of this type are also suitable for the preparation of anisotropic polymer coatings for use in the field of non-linear optics.

The multifarious methods of preparing radiation-curable systems can be inferred, for example, from W. S. De Forest: Photoresist Materials and Processes, McGraw-Hill, New York, 1975, and also German Patent Specifications 2,380,830, 2,437,348 and 2,722,264 and European Patent Specification 3,002.

The processes and methods hitherto known exhibit a number of disadvantages. Thus their sensitivity is frequently unsatisfactory, as a result of which exposure times of several minutes are required, using the customary radiation sources, for adequate photo-crosslinking and the layer hardness caused thereby and for ensuring the resolution and edge steepness in relief structures which are necessary in microelectronics. Secondly, inadequate resolving power and unsatisfactory edge steepness, caused, for example, by under-irradiation of the copying layer or by reflections at the substrate, are a source of criticism of the known photopolymerizable systems.

A further problem in coatings of all kinds is the adhesion of the film to the substrate. Detachment of the coating from the substrate occurs frequently, particularly in the case of substrates of an irregular shape or materials subjected to considerable bending stresses.

Finally, there is often a need for coatings which have a homogeneous thickness within a wide area, which in most cases can only be achieved with dificulty by means of conventional coating techniques.

SUMMARY OF THE INVENTION

It is an object of this invention to provide a radiation-curable system which makes it possible to prepare coatings of constant thickness and good adhesion and, in the case of the production of photolithographic structures, permits relief structures having a higher resolution and edge steepness.

Upon further study of the specification and appended claims, further objects and advantages of this invention will become apparent to those skilled in the art.

These objects are achieved by means of a radiation-curable two-layer system comprising a layer which has been applied to a substrate and contains initiators and a superposed layer containing polymerizable monomers or oligomers, characterized in that the initiator is immobilized on a macrostructure.

Two-layer systems which can be cured by radiation are known. Thus U.S. No. 4,551,418 teaches the coating of a substrate by means of a cationic photoinitiator, the exposure of the latter through a copying layer with the production of cationic, initiating molecular fragments and bringing the initiator layer into contact with a monomer which is amenable to cationic polymerization and polymerizes at the exposed points. A relief structure is obtained after the non-polymerized portions of the layer have been removed by washing. However, coatings produced by this process suffer from the same disadvantages indicated above. In particular, the adhesion to the substrate and edge steepness of the polymerized system are inadequate, and the choice of monomers is restricted to the relatively small number of compounds accessible to cationic polymerization.

It has now been found, surprisingly, that a two-layer system containing an initiator immobilized on a macrostructure can be polymerized by radiation curing to give coatings of constant thickness and good adhesion and relief structures of high resolution and edge steepness.

The nature of the initiators used is not restricted. It is possible to employ initiators which decompose under the influence of radiation either by a free radical or ionic mechanism and which are suitable for the particular monomers or oligomers.

Immobilization of the photoinitiator can be achieved, for example, by chemical bonding to or on surfaces, in inclusion compounds of the clathrate type, or by embedding in rigid, macro-reticular structures or in polymers by melting or dissolution processes.

For example, a substrate coating in which the mobility of the initiator is considerably restricted is obtained by dissolving a photoinitiator in a polymeric material, applying the solution to a surface and removing the solvent by evaporation, or by applying a melted polymeric material containing a photoinitiator and allowing this material to solidify.

It is preferable to immobilize the initiator by means of a covalent bond. In a preferred embodiment of the present invention, the initiator is attached by a covalent link to a polymer matrix.

Initiators suitable for bonding to the polymer matrix by a covalent bond correspond, for example, to the formula I

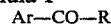

wherein
A is

R is Ar or $CR^2R^3R^4$,
$R^1$ is H, halogen, $C_1$-$C_{12}$-alkyl, $C_1$-$C_{12}$-alkoxy, $C_1$-$C_{12}$-alkythio or A,
$R^2$ and $R^3$ independently of one another are each H, $C_1$-$C_6$alkyl or phenyl, one of these radicals can also be $C_1$-$C_6$-alkylene-O-A, or $R^2$ and $R^3$ together are $C_2$-$C_6$-alkylene or $C_1$-$C_6$-oxaalkylene,
$R^4$ is $OR^5$, $N(R^5)_2$, $SR^5$, or A, $R^5$ is H, $C_1$-$C_6$alkyl or $C_1$-$C_6$alkanoyl, A is

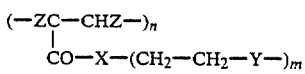

X is O, NH or ($C_1$-$C_6$-alkyl)-H,
Y is O, N or S,
Z is in each case independently of one another H or $CH_3$,
m is 0 to 4 and
n is 2 to $10^6$, subject to the proviso that the compounds of the formula I contain at least one radical of the formula A.

Compounds of this type are described, for example, in EP-A-0,161,463 and DE-A-3,534,645.

Initiators which are attached by a covalent link to a substrate surface are also preferred within the scope of the present invention. In this context, a substrate is to be understood as meaning any coatable surface, such as, for example, paper, cardboard, wood, glass, metal or polymeric materials. A bond is created between the reactive groups located on the surface of these materials and the initiator, which is also equipped with a reactive group. Particularly suitable reactive groups are appropriately substituted silanes of the formula I wherein Ar, R, $R^1$, $R^2$, $R^3$, $R^4$, $R^5$, X, Y, Z, m and n have the meaning indicated above and A is here a radical

| -W-Si-$R_a^6 R_b^7 R_c^8$ | |
|---|---|
| wherein | |
| $R^6$, $R^7$, and $R^8$ | are each independently H, F, Cl, Br, I, CN, NC, OCN, CW, NC, OCN, NCO, SCN, NCS or $N_3$, $C_1$—$C_{15}$-alkoxy or $C_1$—$C_{15}$-alkanoyl, |
| W | is a direct bond or is $C_1$—$C_{20}$-alkylene wherein one or two non-adjacent $CH_2$ groups can also be repaced by O, N or S, and |
| a, b and c | are 0, 1, 2 or 3, | subject to the proviso that $a+b+c=3$ and at least one of the substituents $R^6$, $R^7$ and $R^8$ is other than hydrogen.

Examples of initiators containing silyl groups of this type are disclosed in EP-B 3,002 or can be prepared by methods such as can be seen, for example, in DE-A 3,521,201 or DE-A 3,601,742.

Suitable polymerizable compounds are monoethylenically or poly-ethylenically unsaturated monomes, oligomers or prepolymers or mixtures thereof which are capable of polymerization which can be initiated either by means of free radicals or by ionic compounds. The state of the art offers a large selection of suitable compounds for this purpose.

Examples of suitable ethylenically unsaturated compounds are ethylene, propylene, butene, isobutylene, butadiene, isoprene, vinyl chloride, vinylidene chloride, vinylidene cyanide, acrylic acid, methacrylic acid, acrylonitrile, methacrylonitrile, acrylamide, methacrylamide, methyl, ethyl, n-butyl, tert.-butyl, cyclohexyl, 2-ethylhexyl, benzyl, phenoxyethyl, hydroxyethyl, hydroxypropyl, lower alkoxygethyl or tetrahydrofuryl acrylate or methacrylate, vinyl acetate, propionate, acrylate or succinate, N-vinylpyrrolidone, N-vinylcarbazole, styrene, divinylbenzene, substituted styrenes and mixtures of such unsaturated compounds. It is also possible to employ polyunsaturated compounds, such as, for example, ethylene diacrylate, 1,6-hexanediol diacrylate and propoxylated bisphenol A diacrylate and dimethacrylate in the processes according to the invention. Ethylenically unsaturated compounds can be polymerized by a free radical or ionic mechanism.

Examples of monomers suitable for ionic polymerization are vinyl ethers, cyclic esters and ethers, olefins or further compounds such as those listed, for example, in R. W. Lenz: Organic Chemistry of Synthetic High Polymers, Interscience Publishers, New York, 1967.

The term "polymerization" should be understood in the broadest sense. It includes, for example, the further polymerization or cross-linking of polymeric materials, for example prepolymers, the homopolymerization, copolymerization and terpolymerization of simple monomers and also the combination of the types of reaction mentioned.

The free radical or ionic fragments required to initiate polymerization can be formed in various ways, for example by irradiating the monomers with UV light, X-rays or radioactive sources of radiation.

Sunlight or artificial radiation emitters can be used as sources of radiation. Examples of advantageous emitters are high-pressure, medium-pressure or low-pressure mercury vapor lamps and xenon and tungsten lamps; it is also possible to employ laser light sources and cathode ray tubes.

The production of the two-layer system according to the invention is effected in a simple manner by applying an initiator or mixture of initiators in a dissolved or liquid form to a substrate, for example by coating, printing, dipping or spin-coating to give a macro-structure provided with an initiator attached by covalent bonds and/or a layer of initiator molecules anchored by covalent bonds to the surface of the substrate.

The desired monomer, oligomer or mixtures thereof, if appropriate in the presence of additives, is applied to this initiator layer by means of the techniques indicated above.

Additives of this type can, for example, be reaction accelerators. Examples of reaction accelerators which can be added are organic amines, phosphines, alcohols and/or thiols containing in every case at least one CH group in an $\alpha$-position relative to the heteroatom. Examples of suitable accelerators are primary, secondary and tertiary aliphatic, aromatic, araliphatic or heterocyclic amines, such as are described, for example, in U.S. Pat. No. 3,759,807. Examples of amines of this type are butylamine, dibutylamine, tributylamine, cyclohexylamine, benzyldimethylamine, dicyclohexylamine, triethanolamine, N-methyldiethanolamine, phenyldiethanolamine, piperidine, piperazine, morpholine, pyridine, quinoline, ethyl p-dimethylaminobenzoate, butyl p-dimethylaminobenzoate, 4,4'-bis-dimethylaminobenzophenone (Michler's ketone) or 4,4'-bis-diethylaminobenzophenone. Particularly preferred amines are tertiary amines, such as, for example, trimethylamine, triisopropylamine, tributylamine, octyldimethylamine, dodecyldimethylamine, triethanolamine, N-methyldiethanolamine, N-butyldiethanolamine, tris-(hydroxypropyl)-amine and alkyl dimethylaminobenzoates.

Further examples of suitable reaction accelerators are trialkylphosphines, secondary alcohols and thiols.

It is also possible to add small quantities of light stabilizers, such as, for example, benzophenone derivatives, benzotriazole derivatives, tetraalkylpiperidines or phenyl salicylates.

Depending on the end use, suitable additives for the monomers to be polymerized are organic additives, such as thixotropic agents, levelling agents, binders, lubricants, delustering agents, plasticizers, wetting agents, silicones for improving the quality of the surface, and anti-floating agents or small amounts of solvents.

The present invention also relates to a process for the production of polymeric coatings from the two-layer systems according to the invention. This is effected by irradiating the monomers or oligomers present on the initiator layer with one of the above-mentioned light sources, which affords a well-adhering polymer layer in which the thickness distribution is virtually homogeneous and is substantially independent of the thickness of the layer of monomer or oligomer originally applied. After irradiation, non-cured constituents present above the polymer layer are removed by washing with a suitable solvent, as described, for example, by W. S. De Forest, ibid.

In a particular embodiment, the substrate which has been provided with the layer of initiator is merely dipped into a medium containing the monomers or oligomers, and the irradiation is then carried out in the immersed state. In this case the photopolymerization is initiated only in the boundary region between the photoinitiator layer and the medium, not in the further medium surrounding the substrate, so that a polymer structure in the form of a homogeneous, well-adhering coating is thus formed only on the substrate. One advantage of this process variant is that it is possible to coat even 3-dimensional objects on all sides in a simple manner or to employ low-viscosity monomer materials or formulations such as, for example, solutions of acrylic acid, which cannot be applied without difficulty in the form of a stable layer of uniform thickness, particularly on non-planar surfaces or substrates having a 3-dimensional shape.

The present invention also relates to a process for the production of relief structures by irradiating the two-layer systems according to the invention through a copying layer or mask. The relief structures obtained after removing the areas not exposed to irradiation by washing and hence not polymerized, are distinguished by a high degree of resolution and great edge steepness.

Finally, the invention also relates to a process for the production, by photolithography, of waveguide structures for integrated optics. Thus it is possible to produce structures having refractive indices differing from those of the adjoining material by exposing a two-layer system according to the invention to light, if appropriate through a copying layer. Structures of this type are suitable for use as waveguides and optical switches, for example after electrodes have been attached. The use of substrates, layers containing initiator or monomers having nonlinear optical properties prove advantageous in this connection.

The properties of the polymer materials obtained can be modified in a manner which is in itself known by copolymerization or mixing with further components, by varying the molecular weights, by adding a very wide variety of inorganic or organic additives and metals and by many further treatments with which polymer experts are familiar.

The two-layer systems according to the invention can be employed with advantage for coating, for example, paper, glass, plastics and metals with radiation-curable paint formulations.

By this means it is possible to produce, by photolithographic processes, relief structures which are used as printing plates, photoresists and electronic control elements.

The field of integrated optics opens up further possible uses. The compositions according to the invention are suitable, in particular, for the production of waveguides, optical switch gear and optical data storage systems.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire text of all applications, patents and publications cited above and below are hereby incorporated by reference.

EXAMPLES

Example 1

Preparation of poly-[4-(2-acryloyloxyethoxy)-phenyl] 2-hydroxy-2-propyl ketone 30 g of [4-(2-acryloyloxyethoxy)-phenyl] 2-hydroxy-2-propyl ketone, 200 ml of tetrahydrofuran and 0.30 g of dibenzoyl peroxide are combined at room temperature and the mixture is heated under reflux for 15–20 hours. The solvent is then removed on a rotary evaporator and 0.5 g of active charcoal is added to the residue, which is stirred and filtered, and 300 ml of n-hexane are then added to the filtrate. The supernatant solution is then decanted off from the precipitated product, and this reprecipitation process is repeated twice. After being dried at room temperature, the product is an amorphous, solid mass, which is readily soluble in the customary organic solvents (acetone, methylene dichloride or ethyl acetate); average molecular weight: approx. 4,000 (determined by gel permeation chromatography); glass transition temperature Tg: 45°–50°.

Example 2

Exposure of poly-[4-(2-acryloyloxyethoxy)-phenyl] 2-hydroxy-2-propyl ketone and trimethylolpropane triacrylate to light A solution of poly-[4-(2-acryloyloxyethoxy)-phenyl] 2-hydroxy-2-propyl ketone in acetone is applied to a glass surface in such a way that a thin film remains after the solvent has evaporated off. Trimethylolpropane triacrylate is applied to this film. This coating is covered at certain points and, after approx. 30 seconds, is then irradiated with a medium-pressure Hg lamp. The coating is then washed several times with acetone, in the course of which it dissolves at the covered areas and adheres to the glass surface in sharp outlines as a hard, insoluble layer at the exposed points.

Example 3

Preparation of
poly-[4-(2-methacryloyloxyethoxy)-phenyl]
2-hydroxy-2-propyl ketone 7.0 g of [4-(2-methacryloyloxyethoxy)-phenyl] 2-hydroxy-2-propyl ketone, 100 ml of ethyl acetate and 0.15 g of dibenzoyl peroxide are combined at room temperature, and the mixture is boiled under reflux. Further portions of 0.15 g of dibenzoyl peroxide are added after 2 hours and after 6 hours, and the solution is boiled under reflux for a total of 15–20 hours. The solvent is then removed on a rotary evaporator, and the residue is dissolved in 100 ml of acetone by stirring, and the solution is filtered. Concentrating the filtrate and drying the residue at room temperature gives an amorphous solid; average molecular weight: approx. 12,000; Tg: approx. 55°.

Example 4

Exposure of
poly-[4-(2-methacryloyloxyethoxy)-phenyl]
2-hydroxy-2-propyl ketone and trimethylolpropane
triacrylate to light A 10% solution of poly-[4-(2-methacryloyloxyethoxy)-phenyl] 2-hydroxy-2-propyl ketone in acetone is spin-coated onto an aluminium sheet at 4,500 r.p.m. for 30 seconds. The substrate coated with the polymeric initiator is then dried at 90° for 15 minutes. Trimethylolpropane triacrylate is then spin-coated at 2,000 r.p.m. for 5 seconds.

For exposure, the aluminium sheets provided with the two-layer system are passed under two medium-pressure mercury lamps (radiation output $2\times80$ watts/cm) on a conveyor belt at a speed of 2.5 m/minute and are thus cure.

This gives a well-adhering coating which shows no tendency at all to fracture or flake off even after the substrate has been bent several times. The film thickness values determined by means of a thickness measuring instrument are $0.635\pm0.015$ μm over the whole area of the coating.

Example 5

Production of a waveguide structure

A vinylidene polymer doped with methyl N-(2,4-dinitrophenyl)-alaninate (MAP) as specified in EP-A 0,186,999 is coated with a 10% solution in ethanol of α-(3-triethoxysilylpropyl)-benzoin (DE-A 3,624,898). After the solvent has been removed by evaporation at 40°, a layer of trimethylolpropane triacrylate 5 μm thick is applied to the initiator layer by means of a wire-wound draw bar. The system is irradiated through a copying layer for 5 minutes by means of a mercury vapor lamp. After removing uncured monomers by washing with acetone, a waveguide structure having varying refractive indices is obtained.

Example 6

Dip coating

A piece of aluminium foil is coated with an approx. 20% solution in acetone of the polymeric photoinitiator from Example 1, and is then dried at 100° C. for 10 minutes. The coated foil is then placed in 50% aqueous acrylic acid solution and is irradiated through the solution for 1 minute by means of a high-pressure mercury lamp. After being removed from the solution and washed with water, the foil has a well-adhering film of polyacrylic acid which can be swollen in water. No observable polymerization has taken place in the monomer solution.

Example 7 (comparison)

An aluminium foil is coated with an acetone solution of the non-polymeric photoinitiator phenyl 2-hydroxy-2-propyl ketone and is then treated further analagously to Example 6. On being irradiated, virtually the whole liquid phase gels as the result of polymerization. A usable coating is not obtained.

Example 8

An aluminium foil which has been pretreated as in Example 6 is immersed in 2-hydroxyethyl acrylate and irradiated in an analogous manner. A well-adhering, gelatinous coating is obtained. No change takes place in the liquid monomer phase.

Example 9

A clay crock is immersed in an approx. 20% acetone solution of the polymeric photoinitiator from Example 1 and is then dried at 100° C. for 10 minutes. It is then hung in a 50% aqueous solution of acrylic acid and irradiated through the solution from all sides. After being taken out of the monomer solution, which has otherwise remained unchanged, and after being washed with water, the crock is encased on all sides by a uniform layer of polymer.

Example 10

About 1 ml of a 20% acetone solution of the polymeric photoinitiator from Example 1 was applied to a sheet of glass (5 cm×5 cm) and was then applied as a homogeneous layer by the spin-coating process (1 second at 2,000 r.p.m.). The coated sheet of glass was heated at 90° C. for 15 minutes in a drying cabinet in order to remove the solvent. The thickness of the layer applied was then found to be 1.9–2.1 μm by means of a film thickness measuring instrument ("Alpha-step 200", Tencor Instruments).

The sheet of glass was then placed in a quartz dip pipe used as a reaction vessel and was covered with a solution consisting of 97 parts by weight of hexane, 5 parts by weight of 2-propanol and 3 parts by weight of trimethylolpropane triacrylate. A reflux condensor was fitted on top of the reaction vessel.

A UV lamp (type TQ 180, Heraeus Original Hanau) was set up parallel to the dip pipe at a distance of 7 cm so that the sheet of glass coated with the polymeric photoinitiator, located in the dip pipe, could be irradiated with UV light in an optimum manner. After being irradiated for 20 minutes, the irradiated sheet of glass was taken out of the reaction vessel, rinsed with acetone and then dried at 90° C. for 10 minutes. The thickness of the film was then measured. It was 2.5–2.6 μm. The film has, accordingly, become about 0.5 μm thicker during the irradiation with UV light as the result of polymerization of the trimethylolpropane triacrylate from the solution. In a subsequent test, carried out in a similar manner, the exposure distance was shortened to 5 cm and the exposure time was prolonged to 40 minutes. The thickness of the film thus obtained was 4.7–4.8 μm. It has, accordingly, become about 2.75 μm thicker during the UV irradiation.

The preceding examples can be repeated with similar success by substituting the generically or specifically described reactant and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a radiation-curable two-layer system comprising a layer containing polymerization photoinitiator and applied to a substrate, and a second layer containing photopolymerizable compounds superposed on said first layer, the improvement wherein said photoinitiator is immobilized on a macrostructure and attached to a polymer matrix by a covalent bond and wherein said photoinitiator is of the formula $$Ar-CO-R$$

wherein
Ar is

R is Ar or $CR^2R^3R^4$,
$R^1$ is H, halogen, $C_1$-$C_{12}$-alkyl, $C_1$-$C_{12}$-alkoxy, $C_1$-$C_{12}$-alkylthio or A,
$R^2$ and $R^3$ independently of one another are each H, $C_1$-$C_6$-alkyl or phenyl, or one of $R^2$ and $R^3$ is $C_1$-$C_6$-alkylene-O-A, or $R^2$ and $R^3$ together are $C_2$-$C_6$-alkylene or $C_1$-$C_6$-oxaalkylene,
$R^4$ is $OR^5$, $N(R^5)_2$, $SR^5$, or A,
$R^5$ is H, $C_1$-$C_6$-alkyl or $C_1$-$C_6$-alkanoyl,
A is

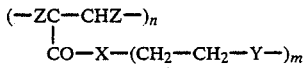

X is O, NH OR ($C_1$-$C_6$-alkyl)—N,
Y is O, N or S,
Z is in each case independently of one another H or $CH_3$,
m is 0 to 4 and
n is 2 to $10^6$,
subject to the proviso that said initiator contains at least one radical of the formula A.

2. A radiation-curable two-layer system according to claim 1, wherein said photopolymerizable compounds are mono-ethylenically or poly-ethylenically unsaturated monomers, oligomers, prepolymers or mixtures thereof.

3. A radiation-curable two-layer system according to claim 1, wherein said substrate is a sheet or foil.

4. A radiation-curable two-layer system according to claim 1, wherein said substrate is metal or glass.

5. A radiation-curable two-layer system according to claim 1, wherein said substrate is a sheet or foil of metal or glass.

* * * * *